US011916554B2

(12) United States Patent
Mozak et al.

(10) Patent No.: US 11,916,554 B2
(45) Date of Patent: Feb. 27, 2024

(54) TECHNIQUES FOR DUTY CYCLE CORRECTION

(71) Applicant: Intel Corporation, Santa Clara, CA (US)

(72) Inventors: Christopher P. Mozak, Portland, OR (US); Ralph S. Li, Portland, OR (US); Chin Wah Lim, Bayan Lepas (MY); Mahmoud Elassal, King City, OR (US); Anant Balakrishnan, Hillsboro, OR (US); Isaac Ali, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 733 days.

(21) Appl. No.: 16/716,234

(22) Filed: Dec. 16, 2019

(65) Prior Publication Data
US 2020/0119721 A1 Apr. 16, 2020

(51) Int. Cl.
H03K 3/00 (2006.01)
G06F 11/16 (2006.01)
H03K 3/017 (2006.01)
H03K 5/135 (2006.01)
H03K 5/156 (2006.01)
H03L 7/081 (2006.01)

(52) U.S. Cl.
CPC ........ *H03K 3/017* (2013.01); *G06F 11/1679* (2013.01); *H03K 5/135* (2013.01); *H03K 5/1565* (2013.01); *H03L 7/0816* (2013.01)

(58) Field of Classification Search
CPC ....... H03K 3/017; H03K 5/135; H03K 5/1565
See application file for complete search history.

(56) References Cited

U.S. PATENT DOCUMENTS

| 7,423,465 | B2 | 9/2008 | Gomm |
| 10,033,365 | B2 | 7/2018 | Elbadry et al. |
| 2011/0316603 | A1 | 12/2011 | Murata et al. |
| 2013/0063191 | A1 | 3/2013 | Patil et al. |
| 2014/0002156 | A1* | 1/2014 | Dwivedi ............ H03K 5/1565 327/175 |
| 2015/0097603 | A1* | 4/2015 | Amirkhany ........... H03K 3/017 327/155 |
| 2019/0363704 | A1 | 11/2019 | Miura et al. |

OTHER PUBLICATIONS

Extended European Search Report for Patent Application No. 20194495.6, dated Feb. 24, 2021, 10 pages.

* cited by examiner

*Primary Examiner* — Tuan T Lam
(74) *Attorney, Agent, or Firm* — Compass IP Law PC

(57) ABSTRACT

Examples may include techniques for using a sample clock to measure a duty cycle by periodic sampling a target clock signal based on a prime number ratio of a reference clock frequency. The reference clock frequency used to set a measurement cycle time over which the duty cycle is to be measured. A magnitude of a duty cycle error as compared to a programmable target duty cycle is determined based on the measured duty cycle and the duty cycle is adjusted based, at least in part, on the magnitude of the duty cycle error.

21 Claims, 7 Drawing Sheets

SYSTEM 100

TECHNIQUES FOR DUTY CYCLE CORRECTION

TECHNICAL FIELD

Examples described herein are generally related to clock duty cycle correcting.

BACKGROUND

In some computing systems, a data bus such as an input/output data bus for a memory device may be arranged to operate with double data rate (DDR) transfers of data on both rising and falling edges of a clock signal. DDR may be utilized to achieve higher data transmission rates for accessing various types of volatile or non-volatile memory. A precision of a clock duty cycle is important due to both the rising and falling edges of the clock signal being utilized to enable the higher data transmission rates and to avoid bit errors caused by the clock duty cycle being less precise than expected or targeted.

DETAILED DESCRIPTION

Figure 1:
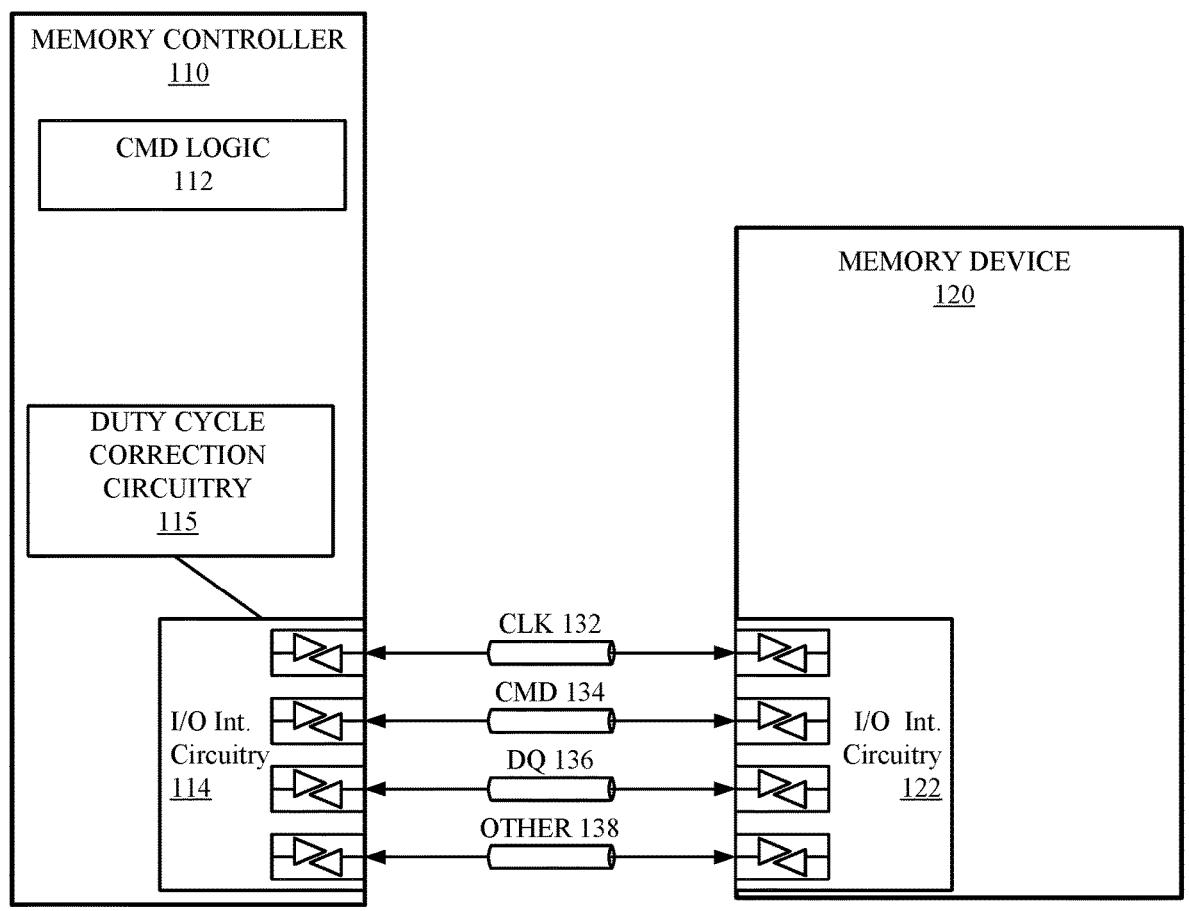
FIG. 1 illustrates an example first system.

As contemplated by various examples, a precision of a clock duty cycle is important when an input/output (I/O) data bus for accessing a memory device is arranged to operate with DDR transfers of data on both rising and falling edges of a clock signal. Some operating specifications for DDR transfers of data may be dictated or required by various memory technologies. For example, a clock duty cycle may be required by these memory technologies to be corrected or tuned to be within 0.5% to 2% of a programmable target duty cycle (e.g., 50%) in order to maintain an acceptable precision. The various memory technologies may include, but are not limited to, DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019), HBM2 ((HBM version 2), originally published by JEDEC in December 2018), DDR5 (DDR version 5, currently in discussion by JEDEC), or others or combinations of memory technologies, and technologies based on derivatives or extensions of such specifications. Similarly, high speed digital designs that use latch based designs for signal propagation also need a well-controlled and precise clock duty cycle.

According to some examples, one technique to correct a clock duty cycle may include use of a resistor-capacitor (RC) filter to obtain a clock duty cycle average. The average value may then be compared against Vcc/2 for single ended clocks or 0 for differential clocks. A comparator output may then drive an analog or digital feedback loop to filter the response and correct the clock duty cycle.

A main downside of RC filter techniques is that an RC filter is relatively large compared to other I/O and clock circuitry and also is relatively slow since it needs to set a bandwidth that is 100× slower than a slowest clock frequency used to generate a duty cycle that is to be corrected. Also, one must wait multiple RC time constants for everything to settle after every change or adjustment to a clock duty cycle. With a linear or even binary search digital feedback loop, this can be an unacceptably slow process. Also, the large RC time constant may be expensive to implement on a large number of signals due to the large size and slowness of RC filters. One important aspect of duty cycle correction is a need to measure a duty cycle on the actual clock used by a target circuit and used to generate the duty cycle. Any additional buffers or gate delays may add error or imprecision to a clock duty cycle measurement and this may be significant for a goal such as <1 picosecond (pS) residual error after a duty cycle correction.

Another technique to correct a clock duty cycle is to use a delay line to measure both the high and low phases of a clock. This technique may be relatively fast compared to an RC filter or other techniques but isn't scalable to a large number of clocks due to need for an adjustable delay line next to every clock being measured. Also, accuracy may be less than desired for single ended clocks since delay line techniques require an exclusive OR (XOR) gate to correct an inversion between measuring high phase vs. low phase of the clock. The use of an XOR gate adds duty cycle error and rise/fall mismatch.

Another technique to correct a clock duty cycle involves various version of "randomly" sampling a target clock with an asynchronous clock that is usually generated using a simple ring oscillator with no or very coarse delay compensation. This technique may be considered simple in that one may just sum up a large number of random samples of the target clock and that count should represent the measured clock duty cycle. This technique may be relatively slow but may be a low cost per clock technique since this technique only requires a sampler and potentially a counter. The counter can be shared among multiple clocks. The sampler is usually a strong arm latch style design to eliminate rise/fall mismatch error, a critical error elimination for most if not all types of duty cycle detector circuitry.

Conventional wisdom may be incorrect in that sampling one periodic signal with another periodic signal from an asynchronous clock is actually a "random" sampling. It may be observed that sampling one periodic signal with another periodic signal isn't at all random. Rather, this technique may be deterministic and that may be good or bad for duty cycle correction. For an example of the bad, if an asynchronous sampling clock happens to be a multiple of a target clock, observed samples may all be at one location of the target clock and will result in a poor representation of the actual or real clock duty cycle. In some extreme cases, an error associated with a random sampling technique may increase by 10× or even 100× whenever the sampling and target clocks have a high least common multiple frequency. The high least common multiple frequency may have a subtle effect that may be hard to detect unless the sampling and target clock frequencies are precisely aligned and may be completely missed even if the clocks are off by as little as 0.1%. Therefore, a need exists to address the assumption of "randomness" for an asynchronous sampling clock in order to more accurately and quickly measure clock duty cycle error. Also, as disclosed herein, example techniques are described that are capable of measuring and adjusting clock duty cycles separately derived from a large number of respective target clock signals (e.g., potentially hundreds) quickly and with more accuracy compared to the techniques mentioned above.

FIG. 1 illustrates a system 100. In some examples, as shown in FIG. 1, system 100 includes a memory controller 110 coupled with a memory device 120. As disclosed herein reference to a memory device or memory devices may apply to different memory types. Memory devices often refers to volatile memory technologies such as DRAM. In addition to, or alternatively to, volatile memory, in some examples, reference to memory devices can refer to a nonvolatile memory device whose state is determinate even if power is interrupted to the device. In one example, the nonvolatile memory device is a block addressable memory device, such as NAND or NOR technologies. A memory device may also include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Descriptions herein referring to a "RAM" or "RAM device" can apply to any memory device that allows random access, whether volatile or nonvolatile. Descriptions referring to a "DRAM", "SDRAM, "DRAM device" or "SDRAM device" may refer to a volatile random access memory device. The memory device, SDRAM or DRAM may refer to the die itself, to a packaged memory product that includes one or more dies, or both. In some examples, a system with volatile memory that needs to be refreshed may also include at least some nonvolatile memory.

Memory controller 110, as shown in FIG. 1, may represent one or more memory controller circuits or devices for system 100. Also, memory controller 110 may include logic and/or features that generate memory access commands in response to the execution of operations by a processor (not shown). In some examples, memory controller 110 may access memory device 120. Memory device 120 may be organized and managed by memory controller 110 via one or more channels. Timing, data transfer, command and address exchanges, and other operations may be routed via these one or more channels. A coupling of memory controller 110 with memory device 120 may refer to an electrical coupling, communicative coupling, physical coupling, or a combination of these. Physical coupling may include direct contact. Electrical coupling, for example, includes an interface or interconnection that allows electrical flow between components, or allows signaling between components, or both. Communicative coupling, for example, includes connections, including wired or wireless, that enable components to exchange data.

Memory controller 110 includes I/O interface circuitry 114 to couple to a memory bus, such as a memory channel as referred to above. I/O interface circuitry 114 (as well as I/O interface circuitry 114 of memory device 120) may include pins, pads, connectors, signal lines, traces, or wires, or other hardware to connect the devices, or a combination of these. I/O interface circuitry 114 may include a hardware interface. As shown in FIG. 1, I/O interface circuitry 122 includes at least drivers/transceivers for signal lines. Commonly, wires within an integrated circuit interface couple with a pad, pin, or connector to interface signal lines or traces or other wires between devices. I/O interface circuitry 114 can include drivers, receivers, transceivers, or termination, clocks or other circuitry or combinations of circuitry to exchange signals on the signal lines between memory controller 110 and memory device 120. The exchange of signals includes at least one of transmit or receive. While shown as coupling I/O interface circuitry 114 from memory controller 110 to I/O interface circuitry 114 of memory device 120, it will be understood that in an implementation of system 100 where groups of memory devices may be accessed in parallel and multiple memory devices can include I/O interface circuitry to the same interface of memory controller 110.

In some examples, memory controller 110 may be coupled with memory device 120 via multiple signal lines. The multiple signal lines may include at least a clock (CLK) 132, a command/address (CMD) 134, and write data (DQ) and read data (DQ) 136, and zero or more other signal lines 138. According to some examples, a composition of signal lines coupling memory controller 110 to memory device 120 may be referred to collectively as a memory bus. The signal lines for CMD 134 may be referred to as a "command bus", a "C/A bus" or an ADD/CMD bus, or some other designation indicating the transfer of commands. The signal lines for DQ 136 may be referred to as a "data bus" or a "DQ bus".

According to some examples, independent channels coupling memory controller 110 with memory device 120 may have different clock signals, command buses, data buses, and other signal lines. For these examples, system 100 may be considered to have multiple "buses," in the sense that an independent interface path may be considered a separate bus. It will be understood that in addition to the signal lines shown in FIG. 1, a bus may also include at least one of strobe signaling lines, alert lines, auxiliary lines, or other signal lines, or a combination of these additional signal lines. It will also be understood that serial bus technologies can be used for transmitting signals between memory controller 110 and memory device 120. An example of a serial bus technology is 8B10B encoding and transmission of high-speed data with embedded clock over a single differential pair of signals in each direction. In some examples, CMD 134 represents signal lines coupled with memory device 120. In other examples, multiple memory devices in addition to memory device 120 may share encoding command signal lines of CMD 134, and each has a separate chip select (CS_n) signal line to select a specific memory device.

In some examples, the bus between memory controller 110 and memory device 120 includes a subsidiary command bus routed via signal lines included in CMD 134 and a subsidiary data bus to carry the write and read data routed via signal lines included in DQ 136. In some examples, CMD 134 and DQ 136 may separately include bidirectional lines. In other examples, DQ 136 may include unidirectional write signal lines to write data from the host to memory and unidirectional lines to read data from the memory to the host.

According to some examples, in accordance with a chosen memory technology and system design, signals lines included in other 138 may augment a memory bus or subsidiary bus. For example, strobe line signal lines for a DQS bus.

In some examples, memory device 120 may include a plurality memory die. Separate memory die may interface with multiple (e.g., 2) channels per memory die. A given memory die of memory device 120 may include I/O interface circuitry 122 and may have a bandwidth determined by an interface width associated with an implementation or configuration of the given memory die (e.g., x16 or x8 or some other interface bandwidth). I/O interface circuitry 122 may enable the memory devices to interface with memory controller 110. I/O interface circuitry 122 may include a hardware interface and operate in coordination with I/O interface circuitry 114 of memory controller 110.

According to some examples, memory device 120 may be disposed directly on a motherboard or host system platform (e.g., a PCB (printed circuit board) of a computing device. In other examples, memory device 120 may be organized as a memory module such as a dual inline memory module (DIMM). In other examples, memory device may be incorporated into a same package as memory controller 110. For example, incorporated in a multi-chip-module (MCM), a package-on-package with through-silicon via (TSV), or other techniques or combinations. Similarly, in some examples, memory device 120 may be incorporated a same package as memory controller 110. It will be appreciated that for these and other examples, memory controller 110 may be part of or integrated with a processor.

In some examples, as shown in FIG. 1, memory controller 110 includes CMD logic 112. CMD logic 112 may represents logic and/or features to generate commands to send to memory device 120. The generation of the commands may refer to the command prior to scheduling, or the preparation of queued commands ready to be sent. Generally, the signaling in memory subsystems includes address information within or accompanying the command to indicate or select one or more memory locations where memory device 120 should execute the command. In response to scheduling of transactions for memory device 120, memory controller 110 may issue commands via I/O interface circuitry 114 to cause memory device 120 to execute the commands.

According to some examples, memory controller 110 includes duty cycle correction circuitry 115. Duty cycle correction circuitry 115 refers to circuitry in memory controller 110 to execute duty cycle detection and correction for duty cycles derived from one or more respective target clock signals used for signals routed through I/O interface circuitry 114. For example, signals routed through multiple DQ interfaces or multiple DQ strobe interfaces coupled with DQ 136. As described more below, duty cycle correction circuitry 115 may implement periodic duty cycle correction techniques that build on a concept of periodic sampling a target clock signal with an asynchronous clock to measure a duty cycle. However, unlike the conventional wisdom of "random" sampling using an asynchronous clock to take a large number of samples of a target clock signal, periodic duty cycle correction techniques implemented by duty cycle correction circuitry 115 use a sampling clock that minimizes a required number of samples as compared to "random" sampling techniques. Also, periodic duty cycle correction techniques implemented by duty cycle correction circuitry 115 may speed up duty cycle correction by measuring a magnitude of a duty cycle error during sampling of a target clock signal and calculate a correct feedback loop answer to correct possible duty cycle errors based on as little as a single measurement cycle time that is based on a reference clock frequency.

Figure 2:
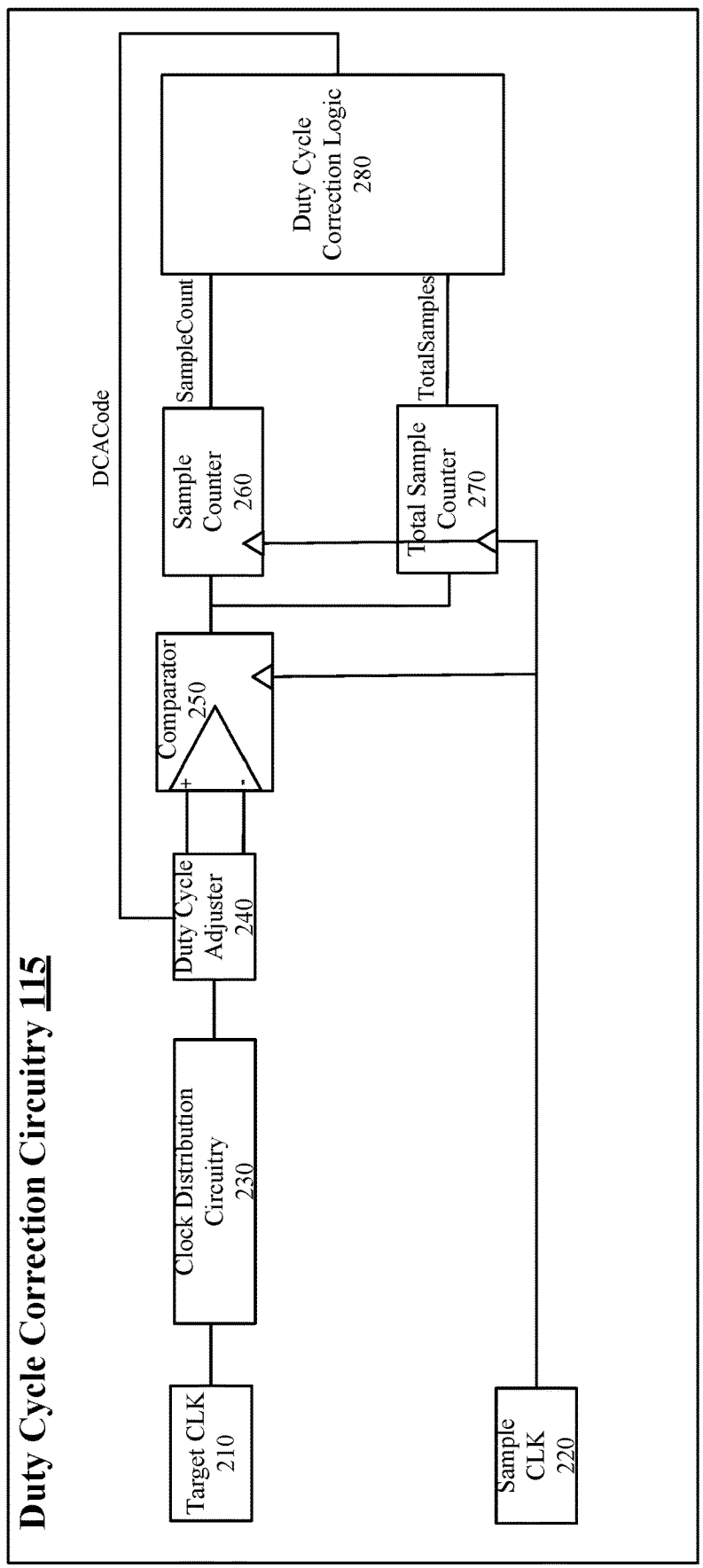
FIG. 2 illustrate an example duty cycle correction circuitry.

FIG. 2 illustrates example duty cycle correction circuitry 115. In some examples, as shown in FIG. 2, duty cycle correction circuitry 115 includes a target clock (CLK) 210, a sample CLK 220, clock distribution circuitry 230, a duty cycle adjuster 240, a comparator 250 (e.g., a strong arm latch comparator), a sample counter 260, a total sample counter 270 and a duty cycle correction logic 280. According to some examples, sampling CLK 220 may be a well-controlled clock generator serving as an asynchronous sampling clock to facilitate duty cycle correction logic 280 measuring and causing duty cycle adjuster 240 to adjust a duty cycle generated by target CLK 210. For these examples, sampling CLK 220 may be a phase lock loop (PLL) or a frequency locked loop (FLL) clock, or a multiplying delayed locked loop (DLL) clock. Likewise, target CLK 210 may be either a PLL or FLL clock. Also, for these examples, clock distribution circuitry 230 may include, but is not limited to, clock distribution and optional circuits such as a DLL, phase interpolator, serializer, transmitter, etc. It is noted that there are several other possible ways to either sample a target clock signal generated by a target clock with a sample clock. It is understood that different methods of combining sample and target clock together can be used to measure a duty cycle, where sample and target clocks may generate signals of different frequencies. For example, a different method may reserve an order such that a target clock is used to sample a second clock. For this example, duty cycle is measured as (Number of times the second clock toggles during a high period of Target clock)/(Total edges of Second clock). This example is limited to the second clock frequency being less than the target clock, since the second clock shouldn't toggle 2 times with a high period of target clock.

In some examples, a common reference clock (not shown) may be used between target CLK 210 and sampling CLK 220. Although examples are not limited to a common reference clock. For these examples, sampling CLK 220 may be set at a highest prime number ratio possible. The highest prime number ratio, for example, may be limited by digital speed paths in sample counter 260 and/or total sample counter 270. Also, the highest prime number ratio possible should not result in sampling CLK 220 having an equal clock frequency as target CLK 210. The highest prime number ratio allows a duty cycle generated by target CLK 210 to be sampled by sampling CLK 220 at a prime number ratio, equally spaced points within a reference clock measurement cycle time. Also, beyond picking a highest prime number ratio possible, any points where two or more target frequency harmonics down-sample to an exact same baseband frequency for the reference clock should be avoided. Another possible constraint is to avoid low sampling frequencies for sampling CLK 220, which may tend to degrade a signal to noise ratio due to multiple images or sampling points mapping down to the base-band frequency for the reference clock.

According to some examples, using an FLL to drive sample CLK 220 and a PLL to drive target CLK 210 may be interesting since an FLL aligns to a correct frequency but doesn't align to phase. For these examples, phase drifts with both residual frequency error and random thermal noise in FLL sample CLK 220 and PLL target CLK 210, creating a random walk between FLL sample CLK 220 and PLL target CLK 210. This target vs. sample phase drift may improve measured duty cycle accuracy by "filling in" between discreate, prime number ratio, spaced points for sampling PLL target CLK 210 to measure the duty cycle within a reference clock measurement cycle time. In some examples, over a relatively short time, substantially all points of a duty cycle generated by PLL target CLK 210 may be sampled by FLL sample CLK 220 to enable duty cycle correction logic 280 to more accurately measure the duty cycle.

In some examples, sample CLK 220 to sample target CLK 210 may enable duty cycle correction logic 280 to measure a duty cycle generated by target CLK 210 that provides both a sign and magnitude for duty cycle error. For these examples, the magnitude of a measured duty cycle error (+/−of 50%) may be used in conjunction with a duty cycle adjuster step size to use a feedback loop that enables duty cycle correction logic 280 to generate a duty cycle adjustment code (DCACode) to cause duty cycle adjuster 240 to correct the measured duty cycle error of a duty cycle generated by target CLK 210 in as little as a single measurement. For example, duty cycle correction logic 280 may implement example equation 1 to determine the DCACode that causes duty cycle adjuster 240 to correct the measured duty cycle error.

DCACode=OldDCACode+(SampleCount/Total-
Samples−DutyCycleTarget)*PercentToDCASt-
eps      Example equation 1:

For example equation 1, OldDCACode may be a DCA code previously used to correct a previously measured duty cycle error. The DCA code, for example, may cause adjustments to the rising and falling slopes of target CLK 210 via use of rise or fall delay skews. SampleCount may be measured by sample counter 260 and SampleCount indicates a count of positive or negative duty cycles detected by comparator 250 for each sampling point trigged by sample CLK 220 during a measurement cycle time. TotalSamples may be measured by total sample counter 270 and TotalSamples indicates total duty cycles detected by comparator 250 for each sampling point trigged by sample CLK 220 during the measurement cycle time. DutyCycleTarget may be a % Duty Cycle target (e.g., 50%). Also, PercentToDCASteps may be a duty cycle adjustment step size (converted to a %) for scaling a correction of the measured duty cycle error. According to some examples, duty cycle adjustment step size for duty cycle correction circuitry 115 may be measured by overriding the OldDCACode being used by duty cycle adjuster 240 to 2 different values and measuring resulting changes in the duty cycle. This may provide data to calculate PercentToDCASteps.

According to some examples, the method of duty cycle measurement mentioned above for example equation 1 may be very useful for other applications such as debug. Generating a clock at a target frequency using a crystal clock reference source is accurate to within a few hundred parts per million. This duty cycle measurement is as accurate as the clock source and may achieve full scale (fs) accuracy with sufficient runtime. Also, duty cycle correction circuitry 115 may be a type of "duty cycle" infrastructure that can be used to measure other delays in a design with high accuracy, providing critical debug information. For example, this measurement method may be used to measure a delay between 2 signals by XORing the two signals together, where the XOR duty cycle measures the delay as a percentage of the clock period.

Figure 3:
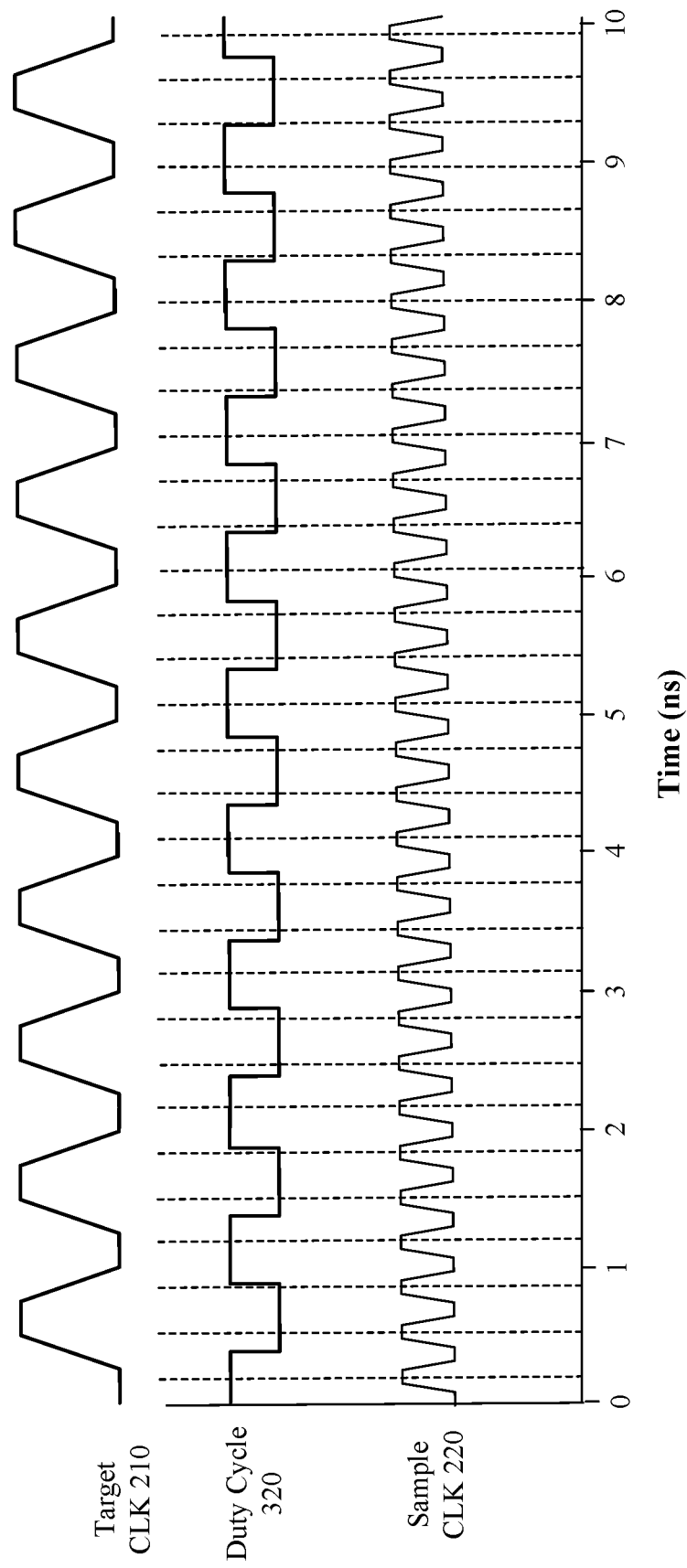
FIG. 3 illustrates an example diagram.

FIG. 3 illustrates an example diagram 300. As shown in FIG. 3, diagram 300 includes a waveform generated by a target CLK 210 that derives or results in duty cycle 320 that may be measured at various sample points of the waveform generated by target CLK 210 over a measurement cycle responsive to sample CLK 220. In some examples, diagram 300 may represent a 100 megahertz (MHz) clock cycle that has a duration of 10 nanoseconds (ns). For these examples, target CLK 210 may generate a target clock signal having a frequency of around 1 gigahertz (GHz) and sample CLK 220 may generate a sample clock signal having a frequency of around 3.1 GHz. As shown in FIG. 3, each high portion of sample clock signal generated by sample CLK 220 may represent a sampling point for determining whether duty cycle 320 is either "on" or "off". Duty cycle 320, for example, may transition between "on" and "off" at the mid-point of the rising and falling edges of the target clock signal generated by target CLK 210. Thus, sample CLK 200 may sample the target clock signal generated by target CLK 210 to measure duty cycle 320 every ⅓₁ of 10 ns or every 32 picoseconds (ps). In other words, after a measurement cycle time of 10 ns, duty cycle 320 is ideally known to within ⅓₁=3%. Also note that 31 is a relatively large prime number ratio of a 100 MHz reference clock.

Figure 4:
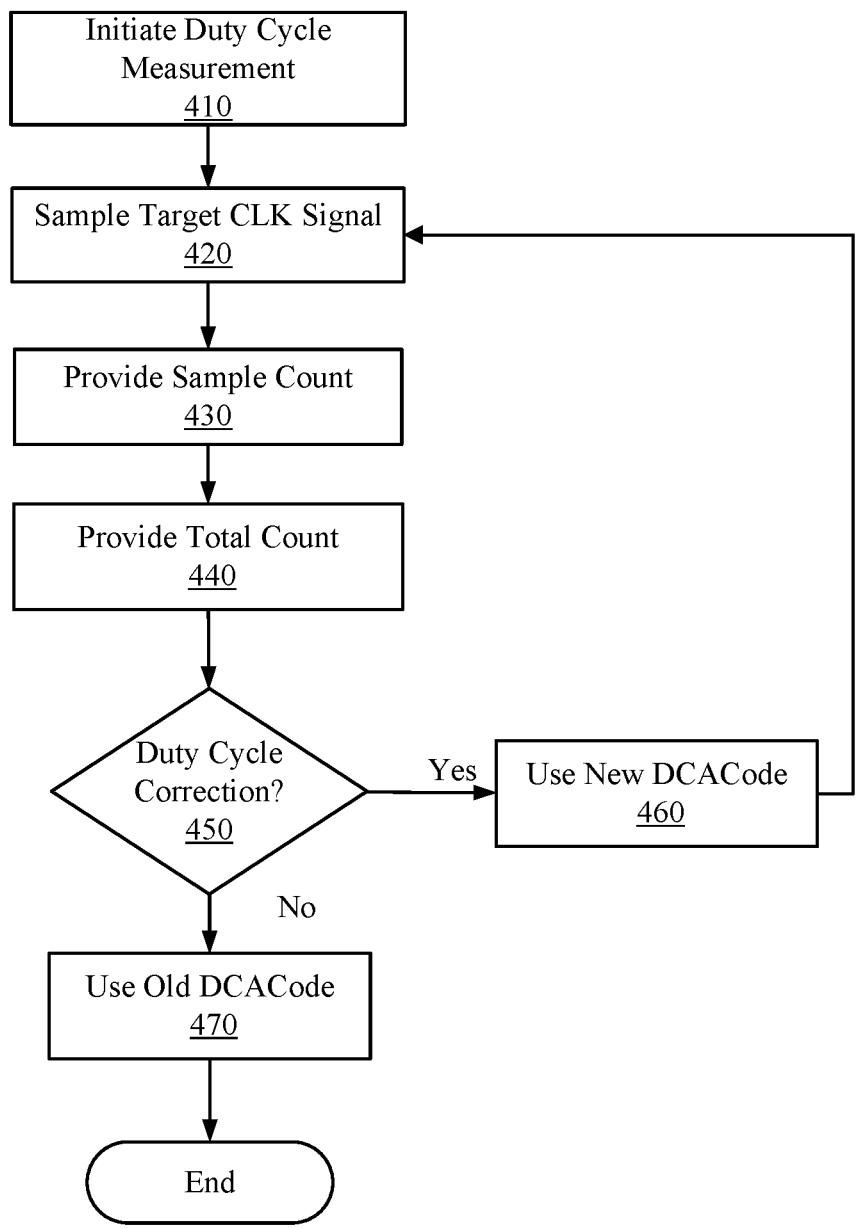
FIG. 4 illustrates an example logic flow.

FIG. 4 illustrates an example logic flow 400. In some examples, logic flow 400 may illustrate an example process or operation to measure a duty cycle by periodic sampling a target clock signal using a sample clock. For these examples, logic flow 400 may be implemented by elements of duty cycle correction circuitry 115 as described above for FIGS. 1-2. These elements of duty cycle correction circuitry 115 may sample a target clock signal and then measure and correct a duty cycle, for example, based on clock/signal frequencies depicted in diagram 300 shown in FIG. 3. However, the example process or operation is not limited to implementation using elements of duty cycle correction circuitry 115 or to the use of the particular target, sample and reference clock frequencies shown in diagram 300.

At block 410, duty cycle measurement may be initiated by duty cycle correction logic 280. In some examples, target CLK 210 may operate at a frequency of about 1 GHz to derive duty cycle 320 and sample CLK 220 may operate at a frequency of 3.1 GHz. For these examples, measurement of duty cycle 320 may be initiated by duty cycle correction logic 280 on a periodic basis. For example, based on a fixed time interval (e.g., every few minutes). In other examples, logic of a memory controller (e.g., CMD logic 112 of memory controller 110) may initiate duty cycle measuring based on an as needed basis. For example, responsive to increased data or command bus errors for I/O interface circuitry of the memory controller possibly caused by a relatively high duty cycle error. Examples are not limited to periodic or an as needed basis for initiating duty cycle measuring.

At block 420, comparator 250 may sample a target clock signal generated by target CLK 210 to detect "on" and "off" portions of duty cycle 320 responsive to sample CLK 220 during a measurement cycle time. As shown in FIG. 3 for diagram 300, the measurement cycle time may be 10 ns and each sample may occur every 32 ps.

At block 430, sample counter 260 may collect a sample count of "on" portions of duty cycle 320 detected by comparator 250 at each sample point caused by sample CLK 220 during the measurement cycle time and provide the sample count as SampleCount to duty cycle correction logic 280. For example, sample counter 260 may count 11 "on" portions during the measurement cycle time.

At block 440, total sample counter 270 may collect a total sample count of both "on" and "off" portions of duty cycle 320 detected by comparator 250 during the measurement cycle time and provide the total sample count as Total-Samples to duty cycle correction logic 280. For example, total sample counter 270 may count a total of 21 "on" and "off" cycles during the measurement cycle time.

At decision block 450, a duty cycle correction logic 280 may use the sample count and total count provided by sample counter 260 and total sample counter 270 to determine if a duty cycle correction is needed. In some examples, a programmable or adjustable DutyCycleTarget may be 50% (e.g., programmable by CMD logic 112). For these examples, no duty cycle correction may be needed if the SampleCount/TotalSamples is within 0.5% of the DutyCycleTarget, no duty cycle correction is needed and logic flow 400 moves to block 470. In other words, no detected duty cycle error greater than 0.5%. If the SampleCount/TotalSamples is not within 0.5% of 50%, duty cycle correction is needed and logic flow 400 moves to block 460. Examples are not limited to a detected duty cycle error or +/−0.5%.

At block 460, a new DCACode is determined by duty cycle correction logic 280 using example equation 1. In some examples, the OldDCACode may set a per bit delay skew for rise and fall codes used by duty cycle adjuster 240 to adjust the target clock signal generated by target clock 210 that derived duty cycle 320 during the measurement cycle time. As mentioned previously, SampleCount provided by sample counter 260, in some examples, may be 11 and TotalSamples provided by total sample counter 270, in some examples, may be 21. Thus, the measured duty cycle is 11/21=0.523 or 52.3%. For this example, the duty cycle error may be (52.3%−50%) or 2.3%. Also, in some examples, PercentToDCASteps may be determined to have a value of 1.5 to reflect a DCA step size for duty cycle correction circuitry 115. Thus, using example equation 1, the new DCACode=OldDCACode−(2.3%*1.5). Logic flow then moves back to block 410 and the new DCACode is then used by duty cycle adjuster 240 to adjust the per bit delay skew and another duty cycle measurement is initiated to see if any further adjustments are needed to cause duty cycle 320 to be within 0.5% of a 50% DutyCycleTarget.

At block 470, the OldDCACode is used by duty cycle adjuster 240 to maintain the previously used per bit delay skew for rise and fall codes to potentially keep duty cycle 320 within 0.5% of a 50% DutyCycleTarget. Logic flow 400 then comes to an end.

Figure 5:
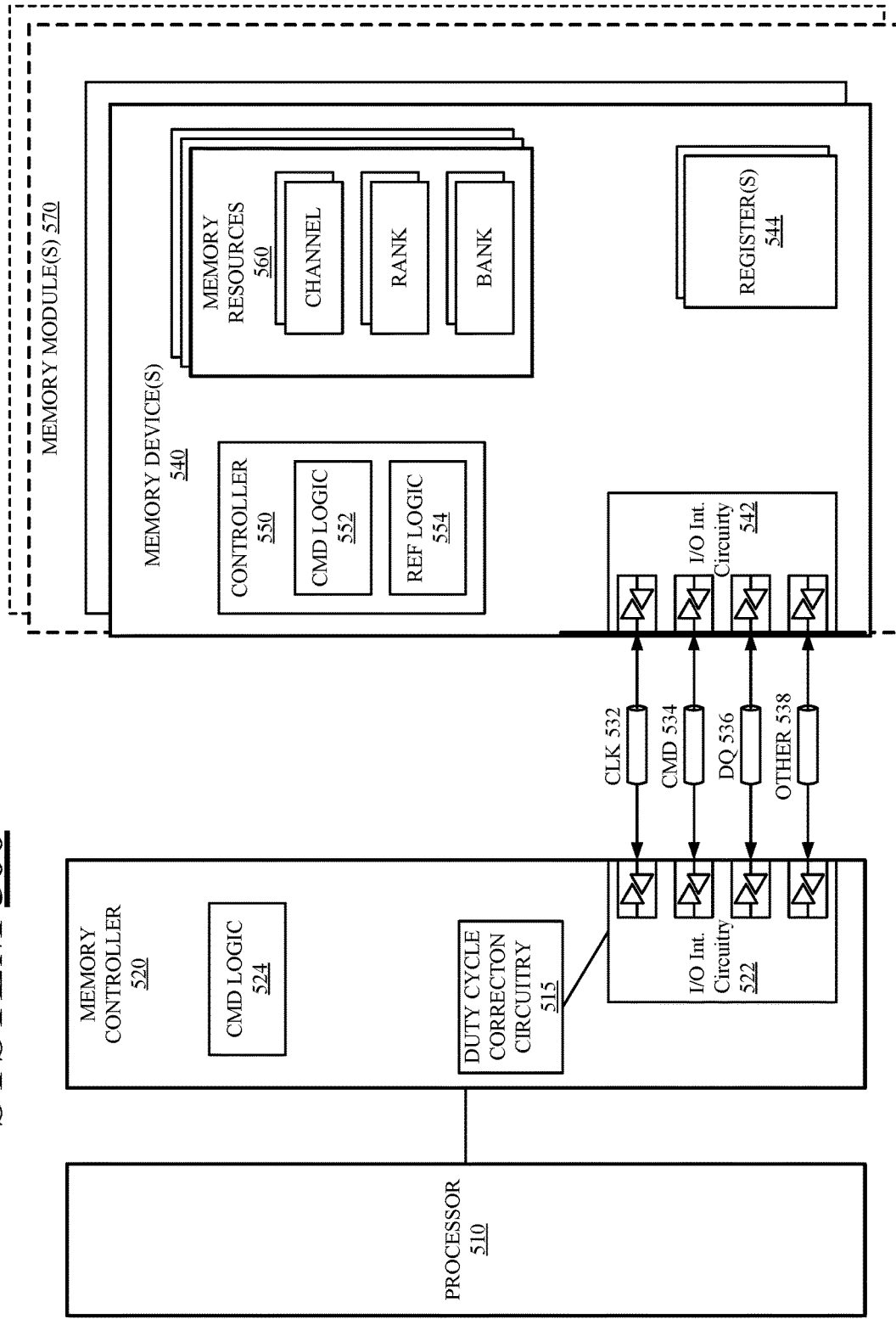
FIG. 5 illustrates an example second system.

FIG. 5 illustrates an example system 500. In some examples, as shown in FIG. 5, system 500 includes a processor and elements of a memory subsystem in a computing device. Processor 510 represents a processing unit of a computing platform that may execute an operating system (OS) and applications, which can collectively be referred to as the host or the user of the memory subsystem. The OS and applications execute operations that result in memory accesses. Processor 510 can include one or more separate processors. Each separate processor may include a single processing unit, a multicore processing unit, or a combination. The processing unit may be a primary processor such as a central processing unit (CPU), a peripheral processor such as a graphics processing unit (GPU), or a combination. Memory accesses may also be initiated by devices such as a network controller or hard disk controller. Such devices may be integrated with the processor in some systems or attached to the processer via a bus (e.g., a PCI express bus), or a combination. System 500 may be implemented as a system on a chip (SOC) or may be implemented with standalone components.

Memory controller 520, as shown in FIG. 5, may represent one or more memory controller circuits or devices for system 500. Also, memory controller 520 may include logic and/or features that generate memory access commands in response to the execution of operations by processor 510. In some examples, memory controller 520 may access one or more memory device(s) 540. Memory device(s) 540 may be organized and managed through different channels, where these channels may couple in parallel to multiple memory devices via buses and signal lines. Each channel may be independently operable. Thus, separate channels may be independently accessed and controlled, and the timing, data transfer, command and address exchanges, and other operations may be separate for each channel.

According to some examples, settings for each channel are controlled by separate mode registers or other register settings programmed to or set in one or more register(s) 544. For these examples, memory controller 520 may manage a separate memory channel, although system 500 may be configured to have multiple channels managed by a single memory controller, or to have multiple memory controllers on a single channel. In one example, memory controller 520 is part of processor 510, such as logic and/or features of memory controller 520 are implemented on the same die or implemented in the same package space as processor 510.

Similar to memory controller 110 of system 100, memory controller 520 includes I/O interface circuitry 522 to couple to a memory bus. As shown in FIG. 5, I/O interface circuitry 522 includes at drivers/transceivers for signal lines. I/O interface circuitry 522 may include drivers, receivers, transceivers, termination, clocks or other circuitry or combinations of circuitry to exchange signals on the signal lines between memory controller 520 and memory device(s) 540. The exchange of signals includes at least one of transmit or receive. While shown as coupling I/O interface circuitry 522 from memory controller 520 to I/O interface circuitry 542 of memory device(s) 540, it will be understood that in an implementation of system 500 where groups of memory device(s) 540 are accessed in parallel, multiple memory devices can include I/O interface circuitry to the same interface of memory controller 520. In an implementation of system 500 including one or more memory module(s) 570, I/O interface circuitry 542 may include interface hardware of memory module(s) 570 in addition to interface hardware for memory device(s) 540. Other memory controllers 520 may include multiple, separate interfaces to one or more memory devices of memory device(s) 540.

In some examples, similar to memory controller 110 shown in FIG. 1, memory controller 520 may be coupled with memory device(s) 540 via multiple signal lines. The multiple signal lines may include at least a CLK 532, a CMD 534, a DQ 536, and zero or more other signal lines 538.

According to some examples, independent channels may have different clock signals, command buses, data buses, and other signal lines. For these examples, system 500 may be considered to have multiple "buses," in the sense that an independent interface path may be considered a separate bus. In some examples, CMD 534 represents signal lines shared in parallel with multiple memory device(s) 540. In other examples, multiple memory devices share encoding command signal lines of CMD 534, and each may have a separate chip select (CS_n) signal line to select individual memory device(s) 540.

In some examples, the bus between memory controller 520 and memory device(s) 540 includes a subsidiary command bus routed via signal lines included in CMD 534 and a subsidiary data bus to carry the write and read data routed via signal lines included in DQ 536. In some examples, CMD 534 and DQ 536 may separately include bidirectional lines. In other examples, DQ 536 may include unidirectional write signal lines to write data from the host to memory and unidirectional lines to read data from the memory to the host.

According to some examples, in accordance with a chosen memory technology and system design, signals lines included in other 538 may augment a memory bus or subsidiary bus. For example, strobe line signal lines for a DQS. Based on a design of system 500, or memory technology implementation, a memory bus may have more or less bandwidth per memory device included in memory device(s) 540. The memory bus may support memory devices included in memory device(s) 540 that have either a x32 interface, a x16 interface, a x8 interface, or other interface. The convention "xW," where W is an integer that refers to an interface size or width of the interface of memory device(s) 540, which represents a number of signal lines to exchange data with memory controller 520. The interface size of these memory devices may be a controlling factor on how many memory devices may be used concurrently per channel in system 500 or coupled in parallel to the same signal lines. In some examples, high bandwidth memory devices, wide interface memory devices, or stacked memory devices, or combinations, may enable wider interfaces, such as a x128 interface, a x256 interface, a x512 interface, a x1024 interface, or other data bus interface width.

In some examples, memory device(s) 540 and memory controller 520 exchange data over a data bus via signal lines included in DQ 536 in a burst, or a sequence of consecutive data transfers. The burst corresponds to a number of transfer cycles, which is related to a bus frequency. A given transfer cycle may be a whole clock cycle for transfers occurring on a same clock or strobe signal edge (e.g., on the rising edge). In some examples, every clock cycle, referring to a cycle of the system clock, may be separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8(BL8), and each memory device(s) 540 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

According to some examples, memory device(s) 540 represent memory resources for system 500. For these examples, each memory device included in memory device(s) 540 is a separate memory die. Separate memory devices may interface with multiple (e.g., 2) channels per device or die. A given memory device of memory device(s) 540 may include I/O interface circuitry 542 and may have a bandwidth determined by an interface width associated with an implementation or configuration of the given memory device (e.g., x16 or x8 or some other interface bandwidth). I/O interface circuitry 542 may enable the memory devices to interface with memory controller 520. I/O interface circuitry 542 may include a hardware interface and operate in coordination with I/O interface circuitry 522 of memory controller 520.

In some examples, multiple memory device(s) 540 may be connected in parallel to the same command and data buses (e.g., via CMD 534 and DQ 536). In other examples, multiple memory device(s) 540 may be connected in parallel to the same command bus but connected to different data buses. For example, system 500 may be configured with multiple memory device(s) 540 coupled in parallel, with each memory device responding to a command, and accessing memory resources 560 internal to each memory device. For a write operation, an individual memory device of memory device(s) 540 may write a portion of the overall data word, and for a read operation, the individual memory device may fetch a portion of the overall data word. As non-limiting examples, a specific memory device may provide or receive, respectively, 8 bits of a 128-bit data word for a read or write operation, or 8 bits or 16 bits (depending for a x8 or a x16 device) of a 256-bit data word. The remaining bits of the word may be provided or received by other memory devices in parallel.

According to some examples, memory device(s) 540 may be disposed directly on a motherboard or host system platform on which processor 510 is disposed) of a computing device. Memory device(s) 540 may be organized into memory module(s) 570. In some examples, memory module(s) 570 may represent one or more DIMMs. In some examples, memory module(s) 570 may represent other organizations or configurations of multiple memory devices that share at least a portion of access or control circuitry, which can be a separate circuit, a separate device, or a separate board from the host system platform. In some examples, memory module(s) 570 may include multiple memory device(s) 540, and memory module(s) 570 may include support for multiple separate channels to the included memory device(s) 540 disposed on them.

In some examples, memory device(s) 540 may be incorporated into a same package as memory controller 520. For example, incorporated in a multi-chip-module (MCM), a package-on-package with through-silicon via (TSV), or other techniques or combinations. Similarly, in some examples, memory device(s) 540 may be incorporated into memory module(s) 570, which themselves may be incorporated into the same package as memory controller 520. It will be appreciated that for these and other examples, memory controller 520 may be part of or integrated with processor 510.

As shown in FIG. 5, in some examples, memory device(s) 540 include memory resources 560. Memory resources 560 may represent individual arrays of memory locations or storage locations for data. Memory resources 560 may be managed as rows of data, accessed via wordline (rows) and bitline (individual bits within a row) control. Memory resources 560 may be organized as separate channels, ranks, and banks of memory. Channels may refer to independent control paths to storage locations within memory device(s) 540. Ranks may refer to common locations across multiple memory devices (e.g., same row addresses within different memory devices). Banks may refer to arrays of memory locations within a given memory device of memory device(s) 540. Banks may be divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to access memory resources 560. For example, the same physical memory locations can be accessed over a specific channel as a specific bank, which can also belong to a rank. Thus, the organization of memory resources 560 may be understood in an inclusive, rather than exclusive, manner.

According to some examples, as shown in FIG. 5, memory device(s) 540 include one or more register(s) 544. Register(s) 544 may represent one or more storage devices or storage locations that provide configuration or settings for operation memory device(s) 540. In one example, register(s) 544 may provide a storage location for memory device(s) 540 to store data for access by memory controller 520 as part of a control or management operation. For example, register(s) 544 may include one or more mode registers (MRs) and/or may include one or more multipurpose registers.

In some examples, as shown in FIG. 5, memory device(s) 540 includes controller 550. Controller 550 may represent control logic within memory device(s) 540 to control internal operations within memory device(s) 540. For example, controller 550 decodes commands sent by memory controller 520 and generates internal operations to execute or satisfy the commands. Controller 550 may be referred to as an internal controller and is separate from memory controller 520 of the host. Controller 550 may include logic and/or features to determine what mode is selected based on programmed or default settings indicated in register(s) 544 and configure the internal execution of operations for access to memory resources 560 or other operations based on the selected mode. Controller 550 generates control signals to control the routing of bits within memory device(s) 540 to provide a proper interface for the selected mode and direct a command to the proper memory locations or addresses of memory resources 560. Controller 550 includes command (CMD) logic 552, which can decode command encoding received on command and address signal lines. Thus, CMD logic 552 can be or include a command decoder. With command logic 552, memory device can identify commands and generate internal operations to execute requested commands.

Referring again to memory controller 520, memory controller 520 includes CMD logic 524, which represents logic and/or features to generate commands to send to memory device(s) 540. The generation of the commands can refer to the command prior to scheduling, or the preparation of queued commands ready to be sent. Generally, the signaling in memory subsystems includes address information within or accompanying the command to indicate or select one or more memory locations where memory device(s) 540 should execute the command. In response to scheduling of transactions for memory device(s) 540, memory controller 520 can issue commands via I/O interface circuitry 522 to cause memory device(s) 540 to execute the commands. In some examples, controller 550 of memory device(s) 540 receives and decodes command and address information received via I/O interface circuitry 542 from memory controller 520. Based on the received command and address information, controller 550 may control the timing of operations of the logic, features and/or circuitry within memory device(s) 540 to execute the commands. Controller 550 may be arranged to operate in compliance with standards or specifications such as timing and signaling requirements for memory device(s) 540. Memory controller 520 may implement compliance with standards or specifications by access scheduling and control.

According to some examples, memory controller 520 includes duty cycle correction circuitry 515. Duty cycle correction circuitry 515 may be similar to duty cycle correction circuitry 115 mentioned above in FIGS. 1, 2 and 3 and refers to circuitry in memory controller 520 to execute duty cycle detection and correction for duty cycles generated by one or more respective target clocks used to route signals through I/O interface circuitry 522.

Figure 6:
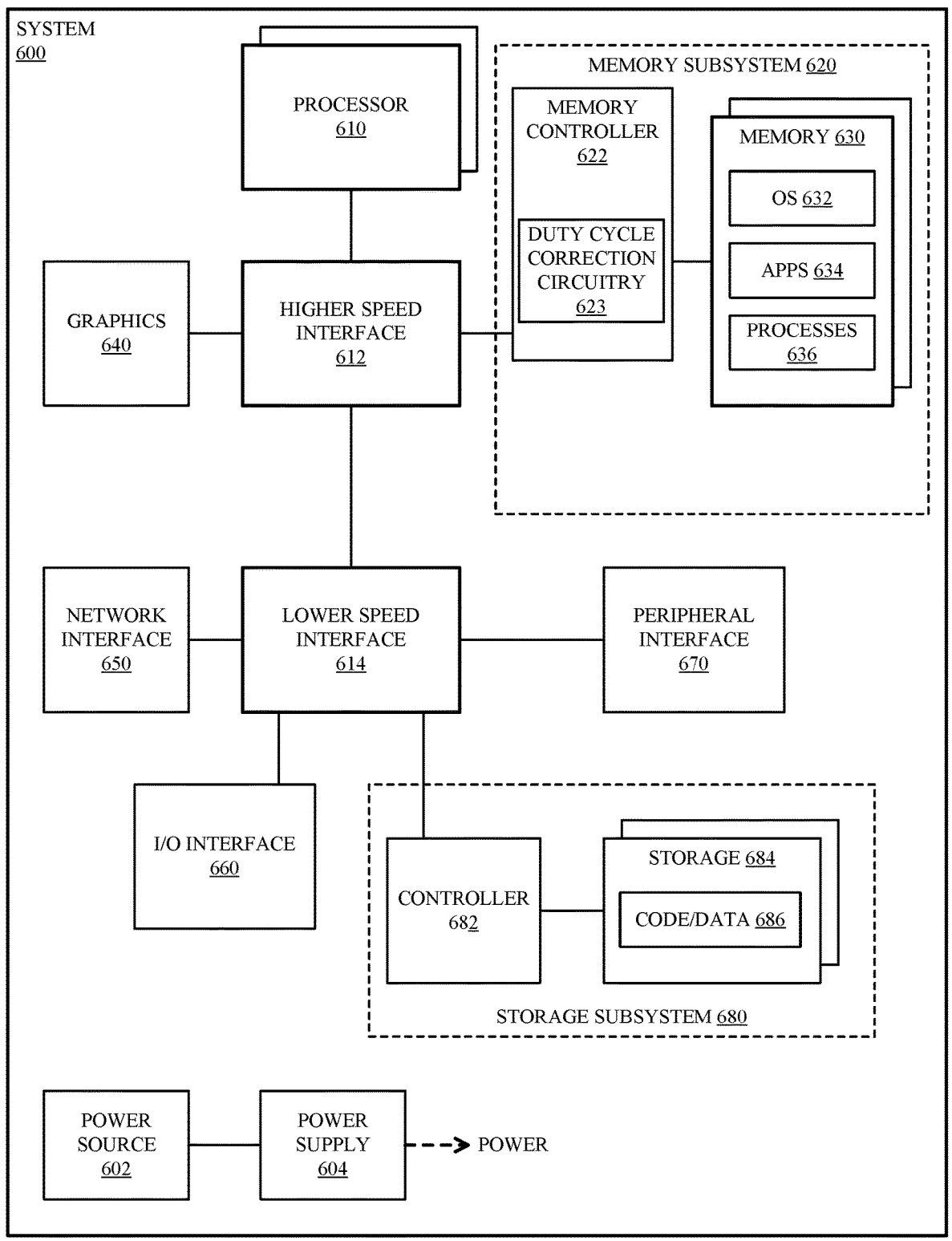
FIG. 6 illustrates an example third system.

FIG. 6 illustrates an example system 600. In some examples, system 600 may be a computing system in which a memory system may implement a CA training mode. System 600 represents a computing device in accordance with any example described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Memory subsystem 620 represents the main memory of system 600 and provides storage for code to be executed by processor 610, or data values to be used in executing a routine. Memory 630 of memory subsystem 620 may include one or more memory devices such as read-only memory (ROM), flash memory, one or more varieties of random access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. As shown in FIG. 6, memory controller 622 may include duty cycle correction circuitry 623 that may function similar to duty cycle correction circuitry 115 mentioned above in FIGS. 1, 2 and 3. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1364 bus.

In one example, system 600 includes interface 614, which can be coupled to interface 612. Interface 614 can be a lower speed interface than interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one example, system 600 includes one or more input/output (I/O) interface(s) 660. I/O interface(s) 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage subsystem 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage device(s) 684 holds code or instructions and data 686 in a persistent state (i.e., the value is retained despite interruption of power to system 600). Storage device(s) 684 can be generically considered to be a "memory," although memory 630 is typically the executing or operating memory to provide instructions to processor 610. Whereas storage device(s) 684 is nonvolatile, memory 630 can include volatile memory (i.e., the value or state of the data is indeterminate if power is interrupted to system 600). In one example, storage subsystem 680 includes controller 682 to interface with storage device(s) 684. In one example controller 682 is a physical part of interface 614 or processor 610 or can include circuits or logic in both processor 610 and interface 614.

Power source 602 provides power to the components of system 600. More specifically, power source 602 typically interfaces to one or multiple power supplies 604 in system 600 to provide power to the components of system 600. In one example, power supply 604 includes an AC to DC (alternating current to direct current) adapter to plug into a wall outlet. Such AC power can be renewable energy (e.g., solar power) power source 602. In one example, power source 602 includes a DC power source, such as an external AC to DC converter. In one example, power source 602 or power supply 604 includes wireless charging hardware to charge via proximity to a charging field. In one example, power source 602 can include an internal battery or fuel cell source.

Figure 7:
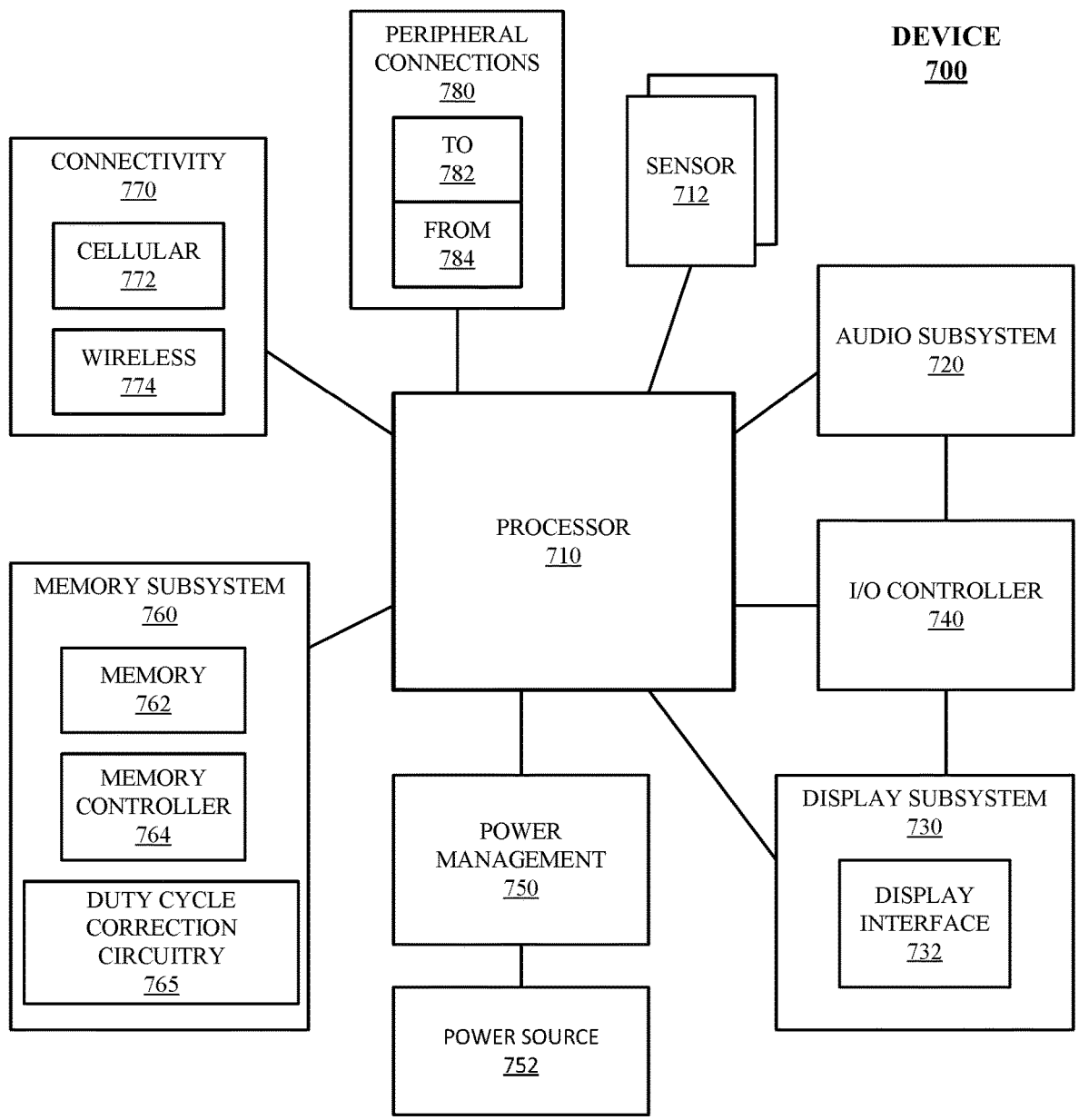
FIG. 7 illustrates an example device.

FIG. 7 illustrates an example device 700. In some examples, device 700 may be a mobile device in which a memory system may implement a CA training mode. Device 700 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and device functions are executed. The processing operations include operations related to I/O (input/output) with a human user or with other devices, operations related to power management, operations related to connecting device 700 to another device, or a combination. The processing operations can also include operations related to audio I/O, display I/O, or other interfacing, or a combination. Processor 710 can execute data stored in memory. Processor 710 can write or edit data stored in memory.

In one example, device 700 includes one or more sensors 712. Sensors 712 represent embedded sensors or interfaces to external sensors, or a combination. Sensors 712 enable device 700 to monitor or detect one or more conditions of an environment or a device in which device 700 is implemented. Sensors 712 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 712 can also include sensors for biometric systems such as fingerprint recognition systems, face detection or recognition systems, or other systems that detect or recognize user features. Sensors 712 should be understood broadly, and not limiting on the many different types of sensors that could be implemented with device 700. In one example, one or more sensors 712 couples to processor 710 via a frontend circuit integrated with processor 710. In one example, one or more sensors 712 couples to processor 710 via another component of device 700.

In one example, device 700 includes audio subsystem 720, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 700 or connected to device 700. In one example, a user interacts with device 700 by providing audio commands that are received and processed by processor 710.

Display subsystem 730 represents hardware (e.g., display devices) and software components (e.g., drivers) that provide a visual display for presentation to a user. In one example, the display includes tactile components or touchscreen elements for a user to interact with the computing device. Display subsystem 730 includes display interface 732, which includes the particular screen or hardware device used to provide a display to a user. In one example, display interface 732 includes logic separate from processor 710 (such as a graphics processor) to perform at least some processing related to the display. In one example, display subsystem 730 includes a touchscreen device that provides both output and input to a user. In one example, display subsystem 730 includes a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, display subsystem includes a touchscreen display. In one example, display subsystem 730 generates display information based on data stored in memory or based on operations executed by processor 710 or both.

I/O controller 740 represents hardware devices and software components related to interaction with a user. I/O controller 740 can operate to manage hardware that is part of audio subsystem 720, or display subsystem 730, or both. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 or display subsystem 730 or both. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one example, I/O controller 740 manages devices such as accelerometers, cameras, light sensors or other environmental sensors, gyroscopes, global positioning system (GPS), or other hardware that can be included in device 700, or sensors 712. The input can be part of direct user interaction, as well as providing environmental input to the system to influence its operations (such as filtering for noise, adjusting displays for brightness detection, applying a flash for a camera, or other features).

In one example, device 700 includes power management 750 that manages battery power usage, charging of the battery, and features related to power saving operation. Power management 750 manages power from power source 752, which provides power to the components of device 700. In one example, power source 752 includes an AC to DC (alternating current to direct current) adapter to plug into a wall outlet. Such AC power can be renewable energy (e.g., solar power, motion based power). In one example, power source 752 includes only DC power, which can be provided by a DC power source, such as an external AC to DC converter. In one example, power source 752 includes wireless charging hardware to charge via proximity to a charging field. In one example, power source 752 can include an internal battery or fuel cell source.

Memory subsystem 760 includes memory device(s) 762 for storing information in device 700. Memory subsystem 760 can include nonvolatile (state does not change if power to the memory device is interrupted) or volatile (state is indeterminate if power to the memory device is interrupted) memory devices, or a combination. Memory subsystem 760 can store application data, user data, music, photos, documents, or other data, as well as system data (whether long-term or temporary) related to the execution of the applications and functions of device 700. In one example, memory subsystem 760 includes memory controller 764 (which could also be considered part of the control of device 700 and could potentially be considered part of processor 710). Memory controller 764 includes a scheduler to generate and issue commands to control access to memory device(s) 762. As shown in FIG. 7, memory controller 764 may include duty cycle correction circuitry 765 that may function similar to duty cycle correction circuitry 115 mentioned above in FIGS. 1, 2 and 3.

Connectivity 770 includes hardware devices (e.g., wireless or wired connectors and communication hardware, or a combination of wired and wireless hardware) and software components (e.g., drivers, protocol stacks) to enable device 700 to communicate with external devices. The external device could be separate devices, such as other computing devices, wireless access points or base stations, as well as peripherals such as headsets, printers, or other devices. In one example, device 700 exchanges data with an external device for storage in memory or for display on a display device. The exchanged data can include data to be stored in memory, or data already stored in memory, to read, write, or edit data.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading, uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" and may be similar to IP blocks. IP cores may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

The follow examples pertain to additional examples of technologies disclosed herein.

Example 1. An example apparatus may include a sample clock to measure a duty cycle by periodic sampling a target clock signal based on a greater than 1 prime number ratio of a reference clock frequency that is used to set a measurement cycle time over which the duty cycle is to be measured. The apparatus may also include duty cycle correction logic. The duty cycle correction logic may determine a duty cycle error as compared to a programmable target duty cycle based on a measured duty cycle during the measurement cycle time. The duty cycle correction logic may also adjust the duty cycle generated by the target clock signal based, at least in part, on the duty cycle error.

Example 2. The apparatus of example 1, the target clock signal to be sampled based on the greater than 1 prime number ratio of the reference clock frequency may include the target clock signal being sampled at a plurality of discrete, equally spaced sample points over the measurement cycle time.

Example 3. The apparatus of example 1 may also include the duty cycle correction logic to adjust the duty cycle based, at least in part, on a magnitude of the duty cycle error and a duty cycle adjustment step size for scaling a correction to the duty cycle error.

Example 4. The apparatus of example 1, the apparatus may be a memory controller including input/output interface circuitry arranged to couple with a memory device. For these examples, the duty cycle may be generated by the target clock signal to facilitate transfers of data, clock, strobe or control signals through at least a portion of the input/output interface circuitry.

Example 5. The apparatus of example 4, the at least a portion of the input/output interface circuitry may be a DQ interface or a DQ strobe interface.

Example 6. The apparatus of example 4, the memory device may be an SDRAM device. For these examples, the SDRAM device may be arranged to operate with double data rate transfers of data on both rising and falling edges of the target clock signal.

Example 7. The apparatus of example 1, the target clock signal may be generated by a first PLL clock and the sample clock may be a frequency lock loop clock, a second PLL clock or a multiplying delayed lock loop clock.

Example 8. The apparatus of example 1, the sample clock to measure the duty cycle by periodic sampling the target clock signal may also include the sample clock to have a sampling rate that avoids at least two target clock signal frequency harmonics down-sampling to a same base-band frequency for the reference clock.

Example 9. An example method may include using a sample clock to measure a duty cycle by periodic sampling of a target clock signal based on a greater than 1 prime number ratio of a reference clock frequency that is used to set a measurement cycle time over which the duty cycle is to be measured. The method may also include determining a duty cycle error as compared to a programmable target duty cycle based on a measured duty cycle during the measurement cycle time. The method may also include adjusting the duty cycle generated by the target clock signal based, at least in part, on the duty cycle error.

Example 10. The method of example 9 may also include sampling the target clock signal based on the greater than 1 prime number ratio via a plurality of discrete, equally spaced sample points over the measurement cycle time.

Example 11. The method of example 9 may also include adjusting the duty cycle based, at least in part, on a magnitude of the duty cycle error and a duty cycle adjustment step size for scaling a correction to the duty cycle error.

Example 12. The method of example 9, the method implemented by a memory controller including input/output interface circuitry arranged to couple with a memory device, the duty cycle generated by the target clock signal for facilitating transfers of data, clock, strobe or control signals through at least a portion of the input/output interface circuitry.

Example 13. The method of example 12, the at least a portion of the input/output interface circuitry may be a DQ interface or a DQ strobe interface.

Example 14. The method of example 12, the memory device may be an SDRAM device, the SDRAM device arranged to operate with double data rate transfers of data on both rising and falling edges of the target clock signal.

Example 15. The method of example 9, comprising the target clock signal generated by a phase lock loop clock and the sample clock is a frequency lock loop clock.

Example 16. The method of example 9, the sample clock to measure the duty cycle by periodic sampling the target clock signal may also include the sample clock to have a sampling rate that avoids at least two target clock signal frequency harmonics down-sampling to a same base-band frequency for the reference clock.

Example 17. An example at least one machine readable medium may include a plurality of instructions that in response to being executed by a system may cause the system to carry out a method according to any one of examples 9 to 16.

Example 18. An example apparatus may include means for performing the methods of any one of examples 9 to 16.

Example 19. An example system may include a memory device and a memory controller. The memory controller may include input/output interface circuitry arranged to couple with the memory device. The memory controller may also include a target clock to generate a target clock signal used to derive a duty cycle. The memory controller may also include a sample clock to measure the duty cycle by periodic sampling the target clock signal based on a greater than 1 prime number ratio of a reference clock frequency that is used to set a measurement cycle time over which the target clock signal is to be sampled. The memory controller may also include duty cycle correction logic to determine a duty cycle error as compared to a programmable target duty cycle based on a measured duty cycle during the measurement cycle time and adjust the duty cycle derived by the target clock signal based, at least in part, on the duty cycle error.

Example 20. The system of example 19, the target clock signal to be sampled based on the greater than 1 prime number ratio of the reference clock frequency may also include the target clock signal to be sampled at a plurality of discrete, equally spaced sample points over the measurement cycle time.

Example 21. The system of example 19 may also include the duty cycle correction logic to adjust the duty cycle based, at least in part, on a magnitude of the duty cycle error and a duty cycle adjustment step size for scaling a correction to the duty cycle error.

Example 22. The system of example 19, the duty cycle may be generated by the target clock signal to facilitate transfers of data, clock, strobe or control signals through at least a portion of the input/output interface circuitry.

Example 23. The system of example 19, the at least a portion of the input/output interface circuitry may be a DQ interface or a DQ strobe interface.

Example 24. The system of example 22, the memory device may be an SDRAM device. The SDRAM device may be arranged to operate with double data rate transfers of data on both rising and falling edges of the target clock signal.

Example 25. The system of example 19, the target clock may be a first PLL clock and the sample clock may be a frequency lock loop clock, a second PLL clock or a multiplying delayed lock loop clock.

Example 26. The system of example 19, the sample clock to measure the duty cycle by periodic sampling the target clock signal further may also include the sample clock to have a sampling rate that avoids at least two target clock signal frequency harmonics down-sampling to a same base-band frequency for the reference clock.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   a sample clock to measure a duty cycle by periodic sampling of a target clock signal based on a greater than 1 prime number ratio of a reference clock cycle time, wherein the reference clock cycle time is used to set a measurement cycle time over which the duty cycle is to be measured; and
   duty cycle correction logic to:
      determine a duty cycle error as compared to a programmable target duty cycle based on a measured duty cycle during the measurement cycle time; and
      adjust the duty cycle generated by the target clock signal based, at least in part, on the duty cycle error.

2. The apparatus of claim 1, the target clock signal to be sampled based on the greater than 1 prime number ratio of the reference clock cycle time comprises the target clock signal to be sampled at a plurality of discrete, equally spaced sample points over the measurement cycle time.

3. The apparatus of claim 1, further comprising the duty cycle correction logic to adjust the duty cycle based, at least in part, on a magnitude of the duty cycle error and a duty cycle adjustment step size for scaling a correction to the duty cycle error.

4. The apparatus of claim 1, the apparatus comprising a memory controller including input/output interface circuitry arranged to couple with a memory device, the duty cycle generated by the target clock signal to facilitate transfers of data, clock, strobe or control signals through at least a portion of the input/output interface circuitry.

5. The apparatus of claim 4, the at least a portion of the input/output interface circuitry comprising a DQ interface or a DQ strobe interface.

6. The apparatus of claim 4, the memory device comprising a synchronous dynamic random access memory (SDRAM) device, the SDRAM device arranged to operate with double data rate transfers of data on both rising and falling edges of the target clock signal.

7. The apparatus of claim 1, comprising the target clock signal generated by a first phase lock loop (PLL) clock and the sample clock is a frequency lock loop clock, a second PLL clock or a multiplying delayed lock loop clock.

8. The apparatus of claim 1, the sample clock to measure the duty cycle by periodic sampling the target clock signal further comprises the sample clock to have a sampling rate that avoids at least two target clock signal frequency harmonics down-sampling to a same base-band frequency for a reference clock.

9. A method comprising:
   using a sample clock to measure a duty cycle by periodic sampling of a target clock signal based on a greater than 1 prime number ratio of a reference clock cycle time, wherein the reference clock cycle time is used to set a measurement cycle time over which the duty cycle is to be measured;
   determining a duty cycle error as compared to a programmable target duty cycle based on a measured duty cycle during the measurement cycle time; and
   adjusting the duty cycle generated by the target clock signal based, at least in part, on the duty cycle error.

10. The method of claim 9, comprising sampling the target clock signal based on the greater than 1 prime number ratio via a plurality of discrete, equally spaced sample points over the measurement cycle time.

11. The method of claim 9, further comprising:
   adjusting the duty cycle based, at least in part, on a magnitude of the duty cycle error and a duty cycle adjustment step size for scaling a correction to the duty cycle error.

12. The method of claim 9, comprising the method implemented by a memory controller including input/output interface circuitry arranged to couple with a memory device, the duty cycle generated by the target clock signal for facilitating transfers of data, clock, strobe or control signals through at least a portion of the input/output interface circuitry.

13. The method of claim 12, the at least a portion of the input/output interface circuitry comprising a DQ interface or a DQ strobe interface.

14. The method of claim 12, the memory device comprising a synchronous dynamic random access memory (SDRAM) device, the SDRAM device arranged to operate with double data rate transfers of data on both rising and falling edges of the target clock signal.

15. A system comprising:
a memory device; and
a memory controller to include:
   input/output interface circuitry arranged to couple with the memory device;
   a target clock to generate a target clock signal used to derive a duty cycle;
   a sample clock to measure the duty cycle by periodic sampling of the target clock signal based on a greater than 1 prime number ratio of a reference clock cycle time, wherein the reference clock cycle time is used to set a measurement cycle time over which the target clock signal is to be sampled; and
   duty cycle correction logic to determine a duty cycle error as compared to a programmable target duty cycle based on a measured duty cycle during the measurement cycle time and adjust the duty cycle derived by the target clock signal based, at least in part, on the duty cycle error.

16. The system of claim 15, the target clock signal to be sampled based on the greater than 1 prime number ratio of the reference clock cycle time comprises the target clock signal to be sampled at a plurality of discrete, equally spaced sample points over the measurement cycle time.

17. The system of claim 15, further comprising the duty cycle correction logic to adjust the duty cycle based, at least in part, on a magnitude of the duty cycle error and a duty cycle adjustment step size for scaling a correction to the duty cycle error.

18. The system of claim 15, comprising the duty cycle generated by the target clock signal to facilitate transfers of data, clock, strobe or control signals through at least a portion of the input/output interface circuitry.

19. The system of claim 18, the at least a portion of the input/output interface circuitry comprising a DQ interface or a DQ strobe interface.

20. The system of claim 18, the memory device comprising a synchronous dynamic random access memory (SDRAM) device, the SDRAM device arranged to operate with double data rate transfers of data on both rising and falling edges of the target clock signal.

21. The system of claim 15, comprising the target clock is a first phase lock loop (PLL) clock and the sample clock is a frequency lock loop clock, a second PLL clock or a multiplying delayed lock loop clock.

* * * * *